(12) United States Patent
Tyan et al.

(10) Patent No.: US 7,564,181 B2
(45) Date of Patent: Jul. 21, 2009

(54) PERFORMANCE ENHANCEMENT LAYER FOR OLED DEVICES

(75) Inventors: Yuan-Sheng Tyan, Webster, NY (US);
Guiseppe Farruggia, Webster, NY (US);
Thomas R. Cushman, Rochester, NY (US); Donald R. Preuss, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 666 days.

(21) Appl. No.: 11/102,358

(22) Filed: Apr. 8, 2005

(65) Prior Publication Data

US 2006/0226767 A1    Oct. 12, 2006

(51) Int. Cl.
*H05B 33/22* (2006.01)

(52) U.S. Cl. ...................... 313/504; 313/506

(58) Field of Classification Search ......... 313/498–512; 315/169.3; 345/36, 45, 76
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 2004/0079941 | A1* | 4/2004 | Yamazaki et al. ............. 257/40 |
| 2006/0061265 | A1* | 3/2006 | Kawamura et al. .......... 313/504 |
| 2006/0125384 | A1* | 6/2006 | Tomita et al. ............... 313/506 |

FOREIGN PATENT DOCUMENTS

| JP | 2002-100483 | 4/2002 |
|---|---|---|
| JP | 2002-208479 | 7/2002 |

OTHER PUBLICATIONS

Tang et al, Electroluminescence of doped organic thin films, J. Appl. Phys. 65 (9) May 1, 1969, pp. 3610-3616.
Tang et al, Organic electroluminescent diodes, Appl. Phys. Lett. 51 (12) Sep. 21, 1987, pp. 913-915.
Matterson et al, Increased Efficiency and Controlled Light Output from a Microstructed Light-Emitting Diode, Adv. Mater. 2001, 13, No. 2 Jan. 16, pp. 123-127.
Gifford, Extraordinary transmission of organic photoluminescence through an otherise opaque metal layer via surface plasmon cross coupling, Appl. Phys. Lett. Vo. 80, No. 20, May 20, 2002, pp. 3679-3681.
Madigan, et al, Improvement of output coupling efficiency of organic light-emitting diodes by backside substrate modification, Appl. Phys. Lett. vol. 76, No. 13, Mar. 27, 2000, pp. 1650-1652.
Lupton et al, Bragg scattering from periodically microstructured light emitting diodes, Appl. Phys. Lett. vol. 77, No. 21, Nov. 20, 2000, pp. 3340-3342.
Gu et al, High-external-quantum-efficiency organic light-emitting devices, Optics Letters, Vo. 22, No. 6, Mar. 16, 1997, pp. 396-398.

* cited by examiner

*Primary Examiner*—Nimeshkumar D. Patel
*Assistant Examiner*—Christopher M Raabe
(74) *Attorney, Agent, or Firm*—Raymond L. Owens

(57) ABSTRACT

An organic light-emitting device includes a substrate; a first electrode and a second electrode positioned relative to the substrate in which at least one of the electrodes is the transparent electrode; an organic light-emitting element including at least a light-emitting layer disposed between the two electrodes; and a performance enhancement layer disposed between the two electrodes; wherein the performance enhancement layer is high index and has a thickness of at least 20 nm.

5 Claims, 7 Drawing Sheets

PERFORMANCE ENHANCEMENT LAYER FOR OLED DEVICES

CROSS REFERENCE TO RELATED APPLICATIONS

Reference is made to commonly assigned U.S. patent application Ser. No. 10/346,424 filed Jan. 17, 2003 entitled "Microcavity OLED Devices" by Yuan-Sheng Tyan et al.; commonly assigned U.S. patent application Ser. No. 10/356,271 filed Jan. 31, 2003 entitled "Color OLED Display with Improved Emission" by Yuan-Sheng Tyan et al., and commonly assigned U.S. patent application Ser. No. 10/822,517 filed Apr. 12, 2004 entitled "OLED Device with Short Reduction" by Yuan-Sheng Tyan et al. the disclosures of which are herein incorporated by reference.

FIELD OF INVENTION

The present invention relates to an OLED structure with enhanced emission performance and enhanced resistance to shorting defects.

BACKGROUND OF THE INVENTION

Organic electroluminescent (EL) devices or organic light-emitting diodes (OLEDs) are electronic devices that emit light in response to an applied potential. Tang et al. in Applied Physics Letters 51, p 913, 1987; Journal of Applied Physics, 65, p3610, 1989; and commonly assigned U.S. Pat. No. 4,769,292 demonstrated highly efficient OLEDs. Since then, numerous OLEDs with alternative layer structures, including polymeric materials, have been disclosed and device performance has been improved.

Organic light-emitting devices (OLED) generally can have two formats known as small molecule devices such as disclosed in commonly-assigned U.S. Pat. No. 4,476,292 and polymer OLED devices such as disclosed in U.S. Pat. No. 5,247,190. Either type of OLED device may include, in sequence, an anode, an organic light-emitting element, and a cathode. The organic light-emitting element disposed between the anode and the cathode commonly includes an organic hole-transporting layer an light-emitting layer and an organic electron-transporting layer. Holes and electrons recombine and emit light in the EL layer. Tang et al. (Appl. Phys. Lett., 51, 913 (1987), Journal of Applied Physics, 65, 3610 (1989), and commonly assigned U.S. Pat. No. 4,769, 292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron-transporting layer and the hole-transporting layer and recombine in the light-emitting layer. Many factors determine the efficiency of this light generating process. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as the bottom-emitting device. Alternatively, a device can include a substrate, a reflective anode, a stack of organic layers, and a top transparent electrode layer. Light generated from the device is emitted through the top transparent electrode. This is commonly referred to as the top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light can actually emit from the device and perform useful functions.

Madigan et al (Appl. Phys. Lett, Vol 76, No. 13, p 1650, 2000) taught the use of high index substrates with micro-lens to enhance the light extraction efficiency. Matterson et al (Adv. Mater. 2001, 13, No. 2, 2001), Lupton et al (Appl. Phys. Lett. Vol 77, No. 21, p3340, 2000) taught the use of corrugated substrates to improve light extraction. Gu et al (Optics Letters, Vol. 22, No. 6, p. 396, 1997) taught the use of substrates with special shaped micro-structures to improve light extraction. Gifford et al (Appl. Phys. Lett. Vol. 80, No. 20, p. 3679, 2002) taught the use of substrates with periodical structure and opaque metal layer to enhance light coupling through surface plasmon cross coupling. All these methods, however, suffer the common problem of much increased complexity in the device construction and at the same time produce light outputs that have high angular and wavelength dependence which are not suitable for many practical applications.

Another common problem frequently encounter in fabrication of OLED device is the yield problem. Because of the small separation between the anode and the cathode, the OLED devices are prone to shorting defects. Pinholes, cracks, steps in the structure of OLED devices, and roughness of the coatings, etc. can cause direct contacts between the anode and the cathode or to cause the organic layer thickness to be smaller in these defective areas. These defective areas provide low resistance pathways for the current to flow causing less or, in the extreme cases, no current to flow through the organic EL element. The luminous output of the OLED devices is thereby reduced or eradicated. In a multi-pixel display device, the shorting defects could result in dead pixels that do not emit light or emit below average intensity of light causing reduced display quality. In lighting or other low resolution applications, the shorting defects could result in a significant fraction of area non-functional. Because of the concerns on shorting defects, the fabrication of OLED devices is typically done in clean rooms. But even a clean environment cannot be effective in eliminating the shorting defects. In many cases the thickness of the organic layers is also increased to beyond what is actually needed for functioning devices in order to increase the separation between the two electrodes to reduce the number of shorting defects. These approaches add costs to OLED device manufacturing, and even with these approaches the shorting defects cannot be totally eliminated.

JP2002100483A discloses a method to reduce the shorting defect due to local protrusions of crystalline transparent conductive films of an anode by depositing an amorphous transparent conductive film over the crystalline transparent conductive film. It alleged that the smooth surface of the amorphous film could prevent the local protrusions from the crystalline films from forming shorting defects or dark spots in the OLED device. The effectiveness of the method is doubtful since the vacuum deposition process used to produce the amorphous transparent conductive films does not have leveling functions and the surface of the amorphous transparent conductive films is expected to replicate that of the underlying crystalline transparent conductive films. Furthermore, the method does not address the pinhole problems due to dust particles, flakes, structural discontinuities, or other causes that are prevalent in OLED manufacturing processes.

JP2002208479A discloses a method to reduce shorting defects by laminating an intermediate resistor film made of a transparent metal oxide of which, the film thickness is 10 nm-10 μm, the resistance in the direction of film thickness is 0.01-2 Ω-cm2, and the ionization energy at the surface of the resistor film is 5.1 eV or more, on the whole or partial of light emission area on a positive electrode or a negative electrode formed into transparent electrode pattern which is formed on a transparent substrate made of glass or resin. Although the method has its merits, the specified resistivity range cannot effectively reduce leakage due to shorting in many OLED displays or devices. Furthermore, the ionization energy requirement severely limits the choice of materials and it does not guarantee appropriate hole injection that is known to be critical to achieving good performance and lifetime in OLED devices. Furthermore, the high ionization energy materials cannot provide electron injection and therefore cannot be applied between the cathode and the organic light emitting layers. It is often desirable to apply the resistive film between the cathode material and the organic light emitting layers or to apply the resistive film both between the cathode and the organic light emitting materials and between the anode and the organic light emitting materials.

SUMMARY OF THE INVENTION

It is an object of the present invention to provide an OLED device with improved light output efficiency.

It is a further object of the present invention to provide an OLED device with reduced susceptibility to shorting defects.

These objects are achieved by providing an organic light-emitting device comprising:

a) a substrate;

b) a first electrode and a second electrode positioned relative to the substrate in which at least one of the electrodes is the transparent electrode;

c) an organic light-emitting element including at least a light-emitting layer disposed between the two electrodes; and d) a performance enhancement layer disposed between the two electrodes; wherein the performance enhancement layer is high index and has a thickness of at least 20 nm.

It is a feature of the present invention that OLED devices made in accordance therewith have improved output efficiency with reduced susceptibility to shorting. These devices may be able to be driven with lower drive voltages.

DETAILED DESCRIPTION OF THE INVENTION

Figure 1:
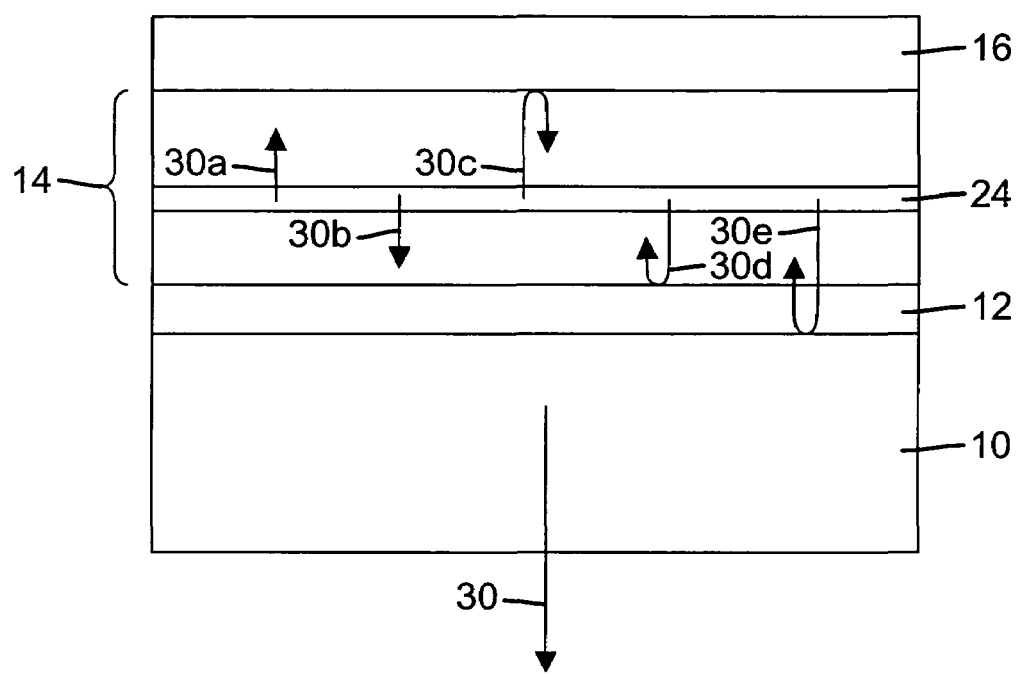
FIG. 1 is a schematic cross sectional view of a prior art bottom emitting OLED device, and is also schematically showing the light beams as a result of reflection from the various interfaces.

A typical OLED device comprises of two electrode layers disposed over a substrate and an organic light-emitting element disposed between the two electrodes. The organic light-emitting element comprises at least a light-emitting layer; but, most frequently, the organic light emitting element comprises of several layers that could include a hole injecting layer, a hole transport layer, a light emitting layer, an electron transport layer, and an electron injecting layer. Sometimes, there can be additional layers such as electron, hole, or exciton blocking layers. It is not likely that these layers, the two electrode layers, and the substrate all have identical optical indexes. Whenever there is an optical index difference between two neighboring materials, a light reflecting surface is formed. As a result, there are many light reflecting surfaces within a typical OLED device and light emitted from the light-emitting layer experiences multiple reflections and interference events before it is emitted into the air. In well-designed OLED devices the layer thicknesses are selected to increase light output in the presence of these reflections and interference events.

It has been recognized in the art that these reflections and interference events can be enhanced to further increase the output intensity of an OLED device. This enhancement is done by using a microcavity structure (commonly-assigned U.S. patent application Ser. No. 10/346,424; U.S. patent application Ser. No. 10/356,271 and commonly-assigned U.S. Pat. No. 6,861,800). In a microcavity OLED the organic light emitting element is sandwiched between two highly reflecting surfaces. For example, the device can have two reflecting metallic electrodes, one essentially opaque and the other one semitransparent. Alternatively, one of the reflecting surfaces can be a metallic electrode and the other a stack of dielectric layers designed to form a quarter-wave-stack (QWS) having high reflectivity and optical transmittance. The OLED structure with these two highly reflecting surfaces forms a Fabry-Perot resonance cavity. When the cavity is constructed to have a resonance wavelength coinciding with the wavelength of the emitted light, the emission intensity of the OLED is greatly enhanced. The enhanced output from a microcavity OLED device has a very narrow bandwidth and is highly angle-dependent. Both the emission wavelength and the emission intensity can change greatly when viewed at different angles from the normal. These characteristics are undesirable for many practical applications. Furthermore, the resonance wavelength of a microcavity device depends strongly on the thickness of the layers between the two highly reflecting surfaces. The manufacturing tolerance is very tight for these devices.

Based on extensive modeling and experimental studies, it has been determined that the aforementioned short comings of microcavity OLED devices can be greatly reduced and the emission enhancing benefit can be substantially retained by adding a performance enhancement layer (PEL) in a conventional non-microcavity OLED structure. The PEL needs to have a "high index", defined here to mean that the index of refraction of the PEL is at least 0.1 larger than that of the transparent electrode over the wavelength range for which the OLED emits the majority of its useable output The PEL needs to be thick, meaning that the layer thickness is at least 20 nm. It is beneficial if the PEL has "low absorption", defined here to mean that the PEL satisfies the relation Kt<lambda/50, where K is the imaginary part of the index of refraction of the PEL, t is the thickness of the PEL and lambda is the wavelength of the light. This condition should hold over the wavelength range for which the OLED emits the majority of its useable output.

The PEL is disposed between the organic light-emitting element and the transparent electrode. The index difference between the PEL and its neighboring materials introduce new reflecting interfaces. These reflecting interfaces and the reflecting electrode layer form a resonance structure that is substantially weaker than observed when two highly reflecting surfaces are used such as those in prior art microcavity OLED structures using two metallic electrodes or those using one metallic electrode and one QWS; yet substantially stronger than observed in conventional non-microcavity OLED devices. The optical interference effect in this structure is strong enough to substantially enhance the emission efficiency beyond the conventional non-microcavity OLED devices but weak enough to substantially eliminate the undesirable effects of the conventional microcavity OLEDs. If the PEL is too thin then the layer will not have a significant effect on the optical behavior of the OLED stack structure and little benefit is realized. If the PEL is too absorbing then the benefit from the resonance tuning is lost to light absorption by the PEL.

It has been recognized that, by choosing materials having an electrical resistivity in a specified range, the PEL can also be made to reduce the detrimental effect of shorting defects and to reduce the operating voltage of the OLED device.

FIG. 1 is a schematic cross-section of a prior art organic light-emitting diode (OLED) device 100 that includes a substrate 10; a first electrode 12 formed over the substrate 10; an organic light-emitting element 14, including one or more layers of organic light-emitting material and at least a light-emitting layer 24, formed over the first electrode 12; and a second electrode 16 formed over the organic light emitting element 14. The OLED device may be encapsulated with a cover 20 to seal the device from the environment. In the most common configuration, first electrode 12 is chosen to be a transparent electrode, which serves as the anode and is made of a transparent conductive oxide layer such as indium-tin oxide (ITO) or indium-zinc oxide (IZO); the second electrode 16 is the cathode and is made of a reflective metal such as Ag, Al, Mg, Ca, Cr, or Mo. Organic light-emitting element 14 frequently includes one or more sub-layers that may also include, in addition to the light-emitting layer, a hole-injecting layer, a hole-transporting layer, an electron-transporting layer, an electron-injecting layer, one or more carrier blocking layers, etc. Whenever there is an optical index difference between two neighboring materials, a light reflecting surface is formed. As a result, there are many light reflecting surfaces within a typical OLED device and light emitted from the light-emitting layer experiences multiple reflections and interference events before it is emitted into the air. Referring to FIG. 1 again, as light is emitted from the light-emitting layer 24 it can go both directions to form light rays 30a and 30b. Light ray 30a can be reflected from second electrode 16 to form reflected ray 30c and light ray 30b can be reflected from the two interfaces between first electrode 12 and its neighbors to form reflected light 30d and 30f. As these reflected light rays traveling along they can be further reflected or refracted to form more light rays. Not shown in FIG. 1 are light rays as a result of refraction at interfaces between the sub-layers within organic light-emitting element 14. All these light rays interfere each other and the actual emitted light 30 from OLED device 100 is a result of all these interference effects. Even though OLED device 100 is commonly regarded to as a non-microcavity device, the optical interference effect is strong enough that the intensity of emitted light 30 depends significantly on the thickness of the layers in the structure, as will be examined further in the examples.

In a prior art microcavity OLED device, first electrode 12 is replaced with a thin, semitransparent metal layer. Due to the high reflectivity of the thin, semitransparent metal layer, the optical interference effect is greatly enhanced and a resonance microcavity structure is formed. The emitted light 30 becomes a narrow peak centered at the resonance wavelength of the microcavity. Because the resonance wavelength of the microcavity is highly angle dependent, emitted light 30 is also highly angle dependent. In addition, the resonance wavelength is a very strong function of the cavity-length that is the total optical thickness of all the layers between the two electrodes. To achieve a desired emission wavelength, the thickness of the layers needs to be precisely controlled, which significantly reduces manufacturing tolerance. Even though a microcavity structure can enhance the efficiency of light emission, it is difficult to be used for practical applications because of the angular dependence and the manufacturing tolerance issues.

Figure 2:
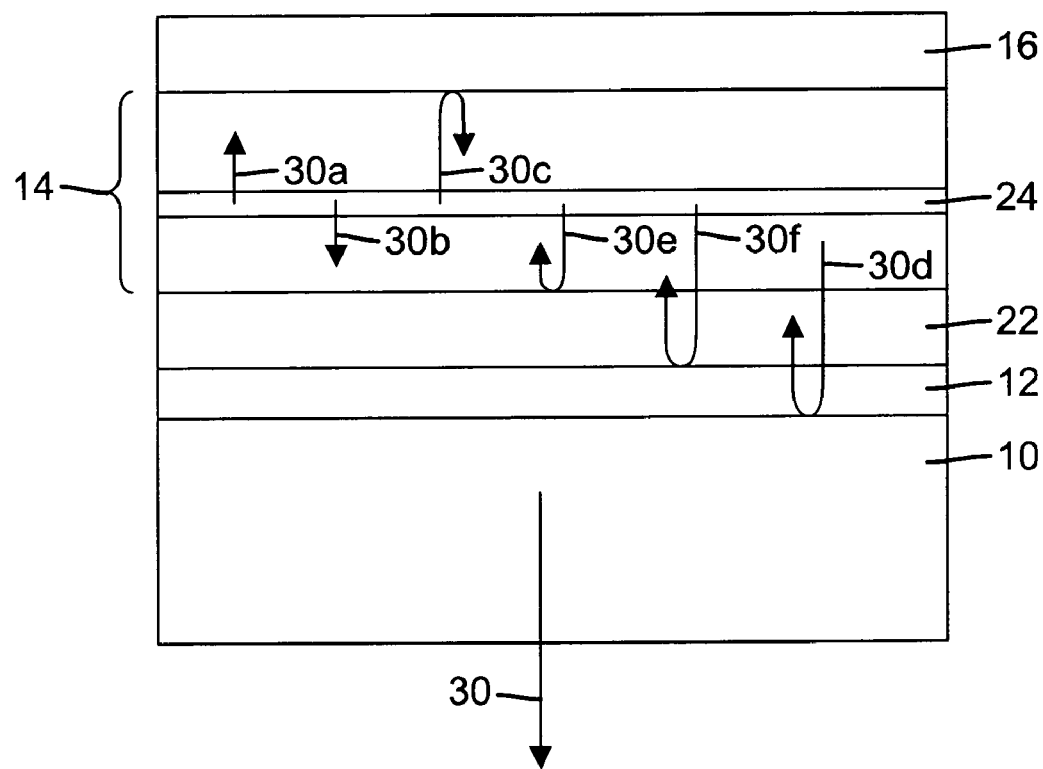
FIG. 2 is a schematic cross sectional view of a OLED device according to the present invention, and is also schematically showing the light beams as a result of reflection from the various interfaces.

FIG. 2 is a schematic cross-sectional view of an OLED device 110 in accordance with the present invention. In OLED device 110 a PEL 22 is disposed between first electrode 12 and organic light-emitting element 14. PEL 22 is selected to have an optical index at least 0.1 larger than that of first electrode 12. Note that the index of first electrode 12 is usually higher than the index of the organic layers in organic light-emitting element 14. Because of the high optical index of PEL, two additional reflecting interfaces are formed. This causes reflected rays 30d and 30e in FIG. 1 to be replaced by reflected rays 30f, 30g and 30h in FIG. 2. These new light rays can be used to enhance the emission efficiency of OLED device 110. This effect is illustrated in the following examples.

COMPARATIVE EXAMPLE 1

Example 1 is a model calculation for the light output of a conventional OLED device in the prior art with a structure illustrated in FIG. 1. In this device, a 1.0 mm thick borosilicate glass plate is used as substrate 10. A 25 nm thick Indium-Tin-Oxide (ITO) layer is used as transparent first electrode layer 12. The organic light-emitting element 14 consists of an N,N'-di(naphthalene-1-yl)-N,N'-diphenyl-benzidine (NPB) layer acting as the hole-transporting layer and a tris(8-hydroxyquinoline)-aluminum(III) (Alq) layer serving both as light-emitting layer 24 and as an electron-transporting layer. A 100 nm Ag layer is used as reflecting second electrode 16. This is a common bottom-emitting OLED structure with first electrode 12 as the anode and second electrode 16 as the cathode.

Figure 3:
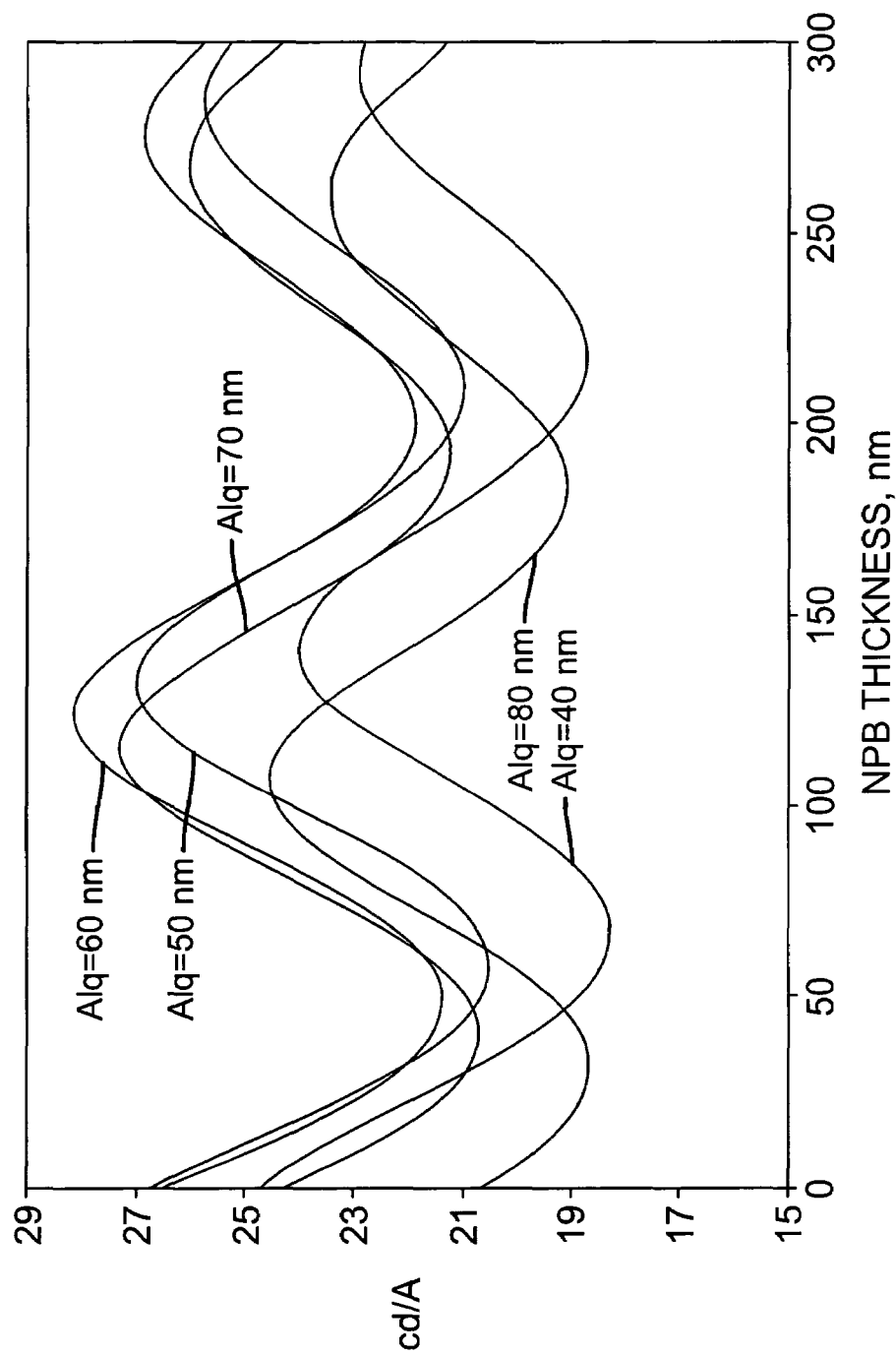
FIG. 3 shows the calculated light output from a prior art OLED device as a function of the Alq and the NPB thickness.

FIG. 3 shows the calculated luminous output in the normal direction in candela/ampere (cd/A) as a function of NPB layer thickness (X axis) for various thicknesses of Alq. Each curve in this figure represents a different Alq thickness. It can be seen that the output efficiency of this non-microcavity OLED device is indeed a function of the thickness of the NPB and Alq layers. The maximum luminous output efficiency of ~28 cd/A is obtained when the NPB thickness is set to ~125 nm and the Alq thickness is set to ~60 nm and the internal quantum efficiency is assumed to be 25%. The spectral output of the NPB-Alq junction was obtained from photoluminescence measurements of an Alq film measured with a commercial radiometer.

EXAMPLE 2

Figure 4:
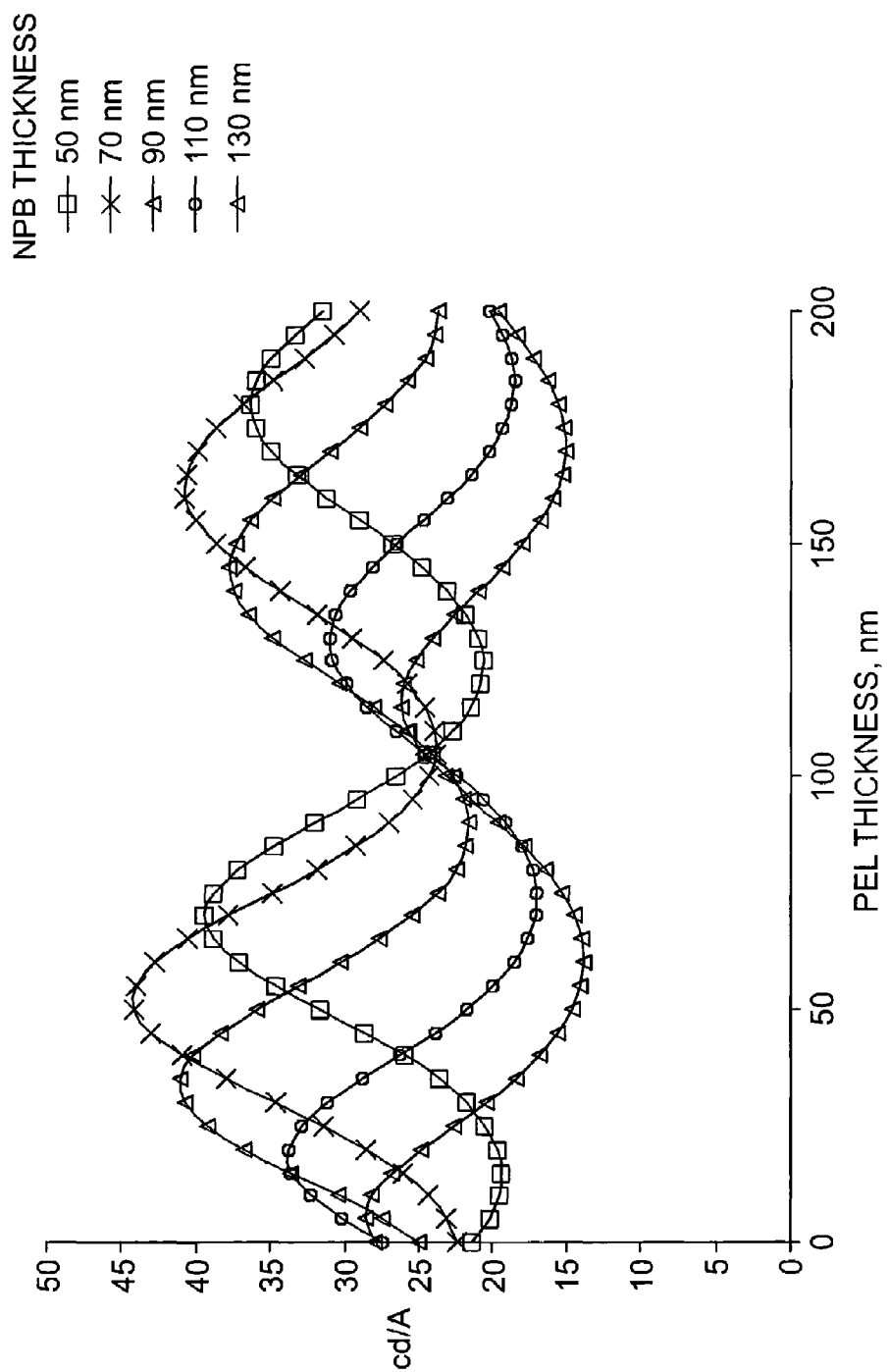
FIG. 4 shows the calculated light output from an OLED device of the present invention as a function of the NPB and the PEL thickness.

Example 2 is a model calculation for the normal direction light output of an OLED structure in accordance with one embodiment of the present invention with a structure as illustrated in FIG. 2. In this device, a PEL 22 is inserted between first electrode 12 and organic light-emitting element 14. The index of the PEL is set to be 2.5 and the thickness of the Alq layer is set to be 60 nm. It has been found that the optimum thickness of Alq remains at ~60 nm even when PEL 22 is inserted. FIG. 4 shows the calculated luminous output in candela/ampere (cd/A). The luminous output is plotted against the thickness of PEL and each curve in FIG. 4 represents a different NPB thickness. It can be seen that the luminous output is over 44 cd/A when the NPB thickness is 70 nm and PEL thickness is 50 nm. This is a significant improvement over the 28 cd/A value obtained for the comparative, non-microcavity sample in Comparative Example 1.

Figure 5:
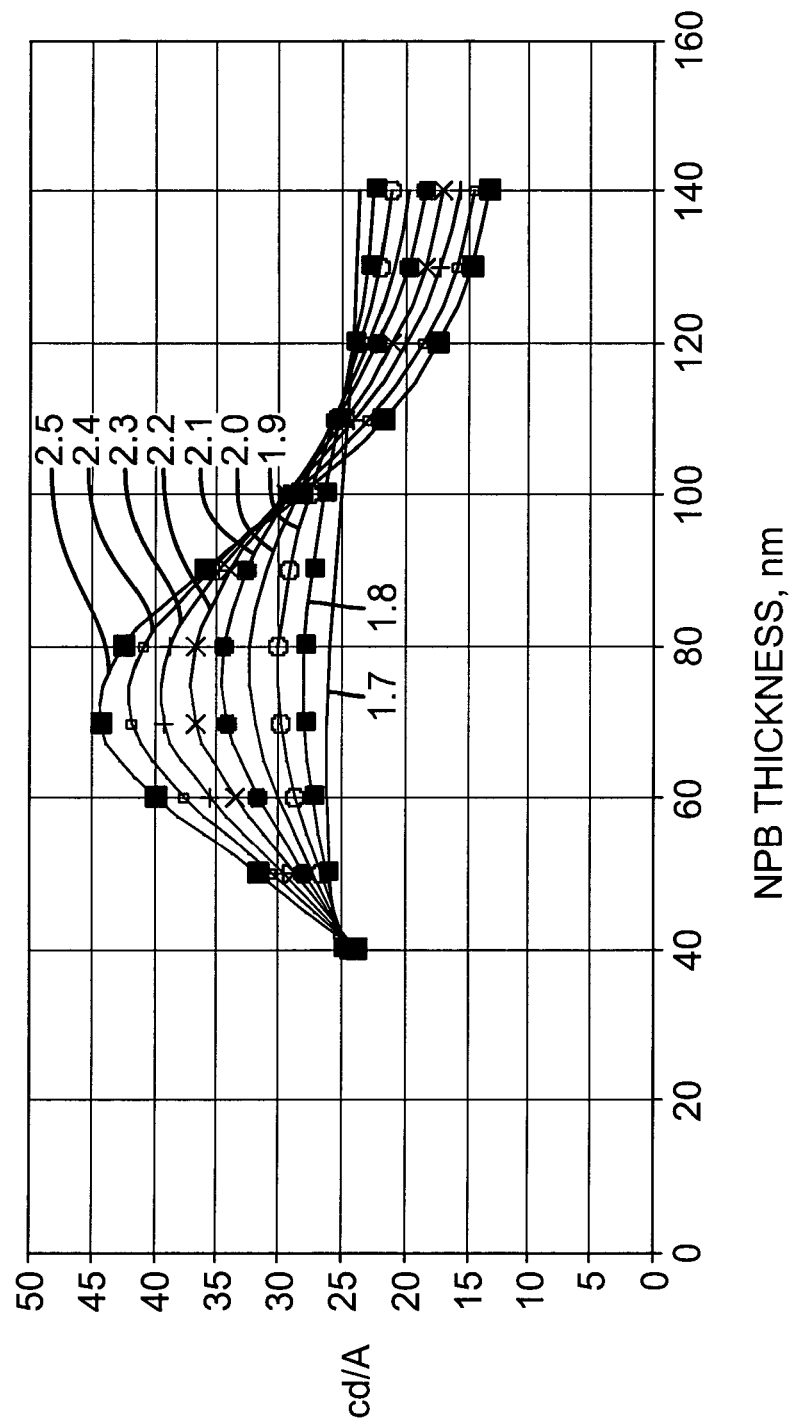
FIG. 5 shows the calculated light output from an OLED device of the present invention as a function of the index of the PEL layer.

FIG. 5 shows the calculated luminous output versus PEL thickness for different values of optical index, n, for PEL. For this calculation the Alq thickness was set to be 60 nm, and the NPB thickness was set to be 70 nm. Each curve in this figure represents a different optical index, n, for PEL. It is seen that the luminous output at the optimum PEL thickness increases with increasing optical index value and becomes appreciably over the 28 cd/A value of the Comparative Example 1 when the optical index, n, is above ~2.0. Note that the optical index of the ITO transparent electrode 12 is about 1.7~1.9 in the visible wavelength region. Therefore, to achieve a significant emission enhancement the optical index of the PEL needs to be at least 0.1 higher than that of the transparent first electrode layer.

Figure 6:
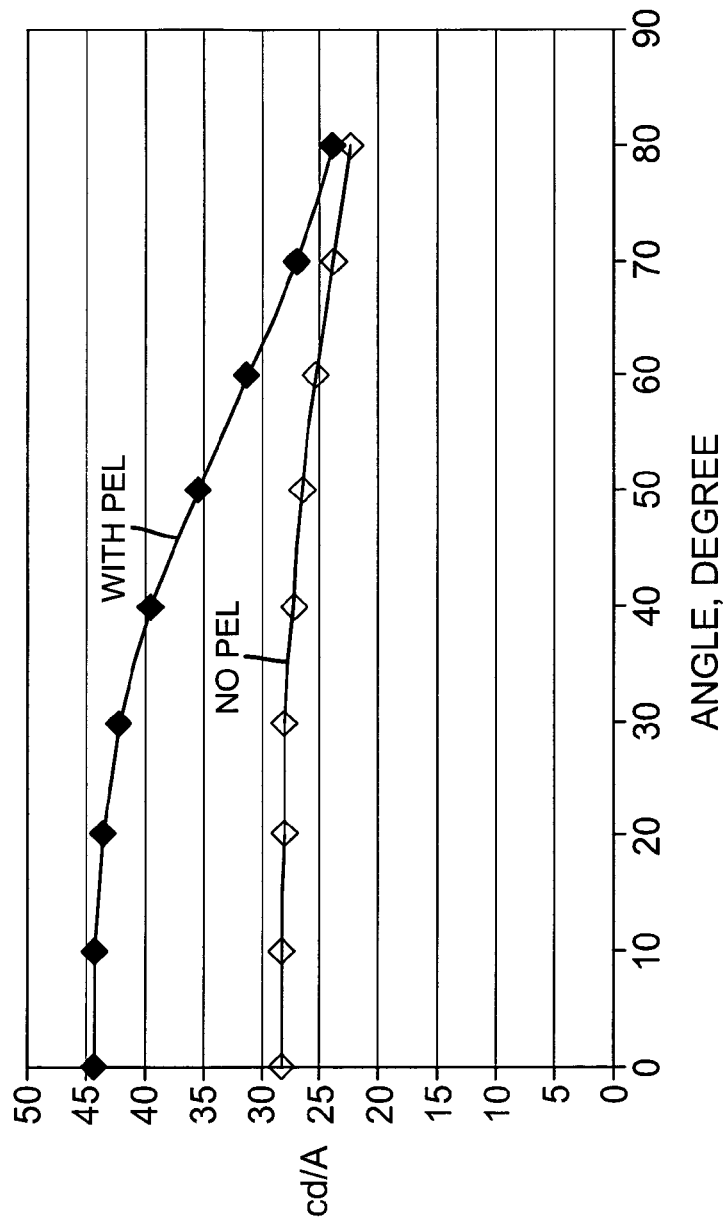
FIG. 6 shows the comparison of the angle dependence of light output from a prior art device without the PEL and a device of the present invention with the PEL.
Figure 7:
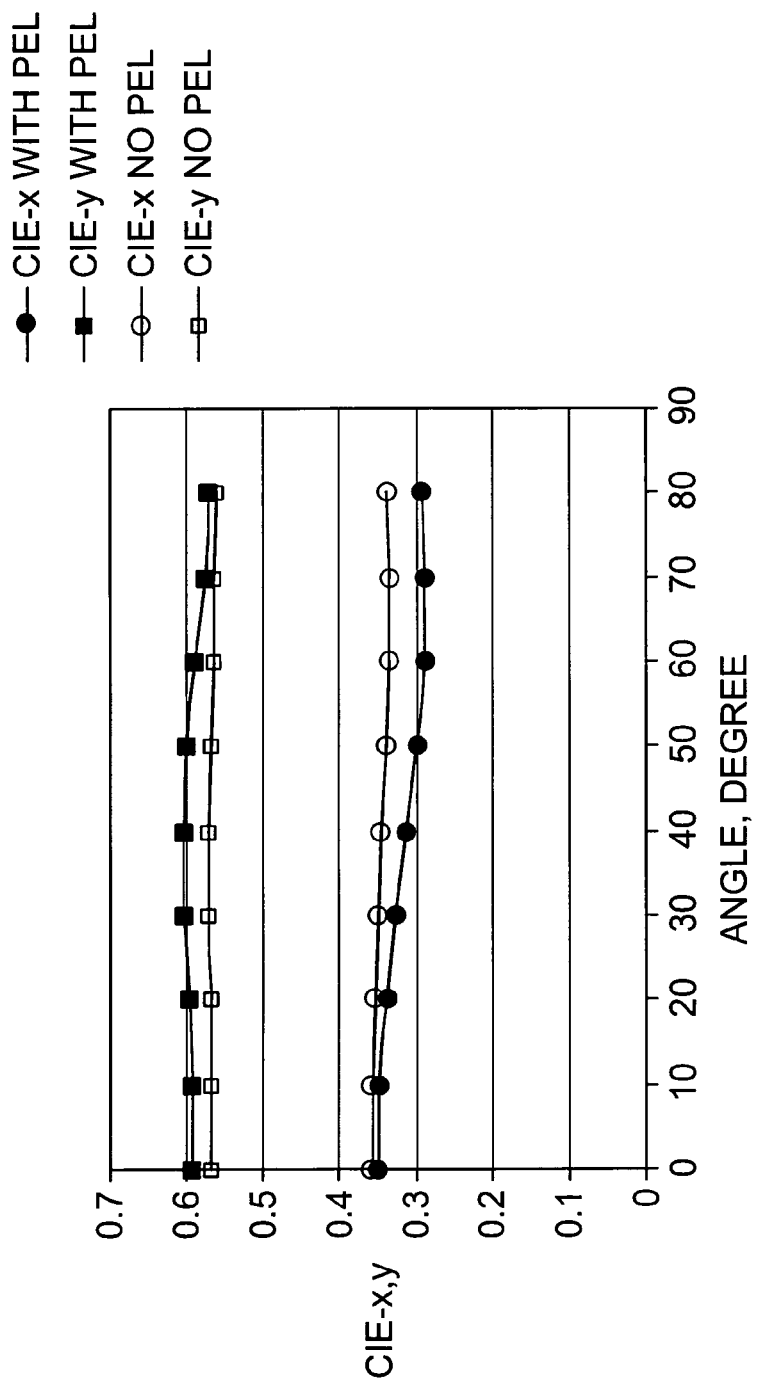
FIG. 7 shows the comparison of the angle dependence of the color of the light output from a prior art device without the PEL and a device of the present invention with the PEL.

FIG. 6 compares the calculated angular dependence of luminous output for the optimized prior art structure in Comparative Example 1 and the new art structure in Example 2. It shows that over all angles the luminous output of the optimized new art structure with the PEL is improved over that of the comparative structure without the PEL. Even though the angle-dependence increases in the invented sample with the PEL, it is still far better than the angle-dependence observed in conventional microcavity OLED devices. FIG. 7 compares the calculated CIE color coordinates for the two samples. It shows that in both cases the color is nearly independent of angle. This is drastically better than the significant angle dependence observed in microcavity OLED devices reported in the literature.

In another embodiment of the present invention, PEL 22 is disposed between first electrode 12 and substrate 10. Model calculations showed that the emission enhancement, the angular dependence, and the dependence on the optical index of PEL 22 are all similar to the embodiment discussed above where PEL 22 is disposed between first electrode 12 and organic light-emitting element 14. When disposed between first electrode layer 12 and organic light-emitting element 14, PEL 22 needs to be electrically conductive as well. Since PEL 22 needs to conduct electrical current only through it thickness, the required electrical conductivity can be quite low. Bulk resistivity values as high as $10^7$ ohms-cm can be tolerated without adding excess serial resistance to the OLED devices. In fact one problem frequently encountered while fabricating an OLED device is the occurrence of shorting defects. Because an OLED structure includes two conductive electrodes separated by a very small thickness of thin-films, surface roughness, or other defects can cause direct contact between the two electrodes causing the OLED device to fail due to a short circuit. The co-pending, commonly assigned U.S. Pat. No. 7,183,707 teaches the use of a short-reduction layer having an electrical resistivity within a specified range to reduce the problem. U.S. Pat. No. 7,183,707 however, does not teach the selection of materials based on their optical properties to achieve the optical enhancement. In one embodiment of the present invention, the high index PEL is selected to have through-thickness resistance fall in the range of $10^{-4}$ ohm-cm$^2$ to 100 ohm-cm$^2$ such that it can also function as a short-reduction layer. The through-thickness resistance is defined as a product of the bulk resistivity and the film thickness. For the optimum PEL thickness of 50 nm in Example 1b, this translates to a bulk resistivity range of 20 ohm-cm to $2 \times 10^7$ ohm-cm.

Many metal oxides can be made to have this level of resistivity by doping with other elements or by creating oxygen deficiency during the deposition process. Examples of such oxides include, but are not limited to zirconium oxide, hafnium oxide, vanadium oxide, niobium oxide, tantalum oxide, molybdenum oxide, tungsten oxide, copper oxide, silver oxide, zinc oxide, cadmium oxide, gallium oxide, indium oxide, germanium oxide, tin oxide, antimony oxide, bismuth oxide, and tellurium oxide. Mixtures of these oxides can also be used. Alternatively, a mixture of a conducting oxide with a non-oxide material can also be used. Examples include, but are not limited to, a mixture of one or more of the oxides from the list above with a sulfide, such as zinc sulfide or cadmium sulfide; a nitride, such as titanium nitride or silicon nitride; or a selenide, such as zinc selenide. Since one of these materials is likely to be used as the transparent conductive first electrode 12, the optical index difference requirement depicts which material is appropriate for use as PEL. For most commonly used material for first electrode 12, such as ITO and IZO, a mixture of zinc sulfide and a conductive oxide such as ITO, IZO, indium oxide, zinc oxide, or tin oxide is a preferred material. The PEL can be prepared by common thin-film deposition methods such as sputtering, thermal evaporation, or chemical vapor deposition. For making a mixture of materials co-sputtering from more than one targets of the component materials can be used, but RF-sputtering using a target having the premixed composition is a preferred method.

The PEL can be patterned to match the patterned structure, such as pixels or serially connected segments, of the OLED device. The patterning can be done by deposition through a shadow mask or by patterning after the deposition process using techniques such as photo-lithography or laser ablation. Alternatively, the PEL can be selected to have adequately high electrical resistivity that it can be blanket deposited over the OLED device covering multiple pixels or serially connected segments.

To ensure proper operation of the OLED device, organic light-emitting element 14 might include a hole-injecting layer over PEL 22. If first electrode 12 is the cathode, than an electron-injecting layer is needed.

It is noteworthy that even with this high resistivity material used as PEL, structures according to the present invention can in fact have a lower operating voltage than corresponding prior art devices. As seen from the calculations in Comparative Example 1 and Example 2, the incorporation of PEL 22 reduces the optimum thickness of NPB from 125 nm to 70 nm. Since the organic materials are generally more insulating than the high resistivity inorganic materials used for the PEL, the series resistance due to the NPB layer is decreased and the operating voltage of the OLED device is reduced as well. For some applications it may be desirable to replace even more of the organic layers to further reduce the operating voltage at the expense of some emission loss.

The discussion above refers to a bottom emitting OLED. The present invention can also be applied to top emitting OLED devices. In such devices, first electrode 12 is essentially opaque and second electrode 16 is transparent. In the top emitting OLED devices PEL 22 can be disposed between organic light-emitting element 14 and second electrode 16 or over second electrode 16.

The invention has been described in detail with particular reference to certain preferred embodiments thereof, but it will be understood that variations and modifications can be effected within the spirit and scope of the invention.

PARTS LIST

10 substrate
12 first electrode
14 organic light-emitting element
16 second electrode
20 cover
22 performance enhancement layer (PEL)
24 light-emitting layer
30 emitted light
30(*a-h*) light ray
100 prior art organic light emitting diode device
110 OLED device

The invention claimed is:

1. An organic light-emitting device comprising:
 a) a substrate;
 b) a first electrode and a second electrode positioned relative to the substrate in which at least one of the electrodes is the transparent electrode;
 c) an organic light-emitting element including at least a light-emitting layer disposed between the two electrodes; and
 d) a performance enhancement layer disposed between the two electrodes; wherein the performance enhancement layer is high index of at least 0.1 larger than that of the transparent electrode, has a thickness of at least 20 nm wherein the through-thickness electrical resistance of the performance enhancement layer is higher than $10^{-4}$ ohm-cm$^2$ and less than 100 ohm-cm$^2$, and comprises a mixture of one or more metal oxides and one or more metal sulfides.

2. The device of claim 1 wherein the performance enhancement layer is located between the transparent electrode and the organic light emitting element.

3. The device of claim 1 wherein the organic light emitting element further includes a charge-injection layer disposed between the organic light-emitting element and the performance enhancement layer.

4. The device of claim 1 wherein the performance enhancement layer is low absorption.

5. The device of claim 1 wherein the metal oxides are selected from indium oxide, gallium oxide, zinc oxide, tin oxide, molybdenum oxide, vanadium oxide, antimony oxide, bismuth oxide, zinc oxide, tantalum oxide, tungsten oxide, niobium oxide, or nickel oxide and the metal sulfide is zinc sulfide.

\* \* \* \* \*